(12) United States Patent
Hoshino

(10) Patent No.: US 9,370,875 B2
(45) Date of Patent: Jun. 21, 2016

(54) IMPRINTING METHOD

(75) Inventor: Satohiko Hoshino, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 849 days.

(21) Appl. No.: 13/585,970

(22) Filed: Aug. 15, 2012

(65) Prior Publication Data

US 2012/0306122 A1  Dec. 6, 2012

Related U.S. Application Data

(63) Continuation of application No. PCT/JP2011/052346, filed on Feb. 4, 2011.

(30) Foreign Application Priority Data

Feb. 16, 2010  (JP) .................................. 2010-031415

(51) Int. Cl.

| | |
|---|---|
| *B29C 33/44* | (2006.01) |
| *B29C 33/42* | (2006.01) |
| *B29C 37/00* | (2006.01) |
| *B29C 59/02* | (2006.01) |
| *B82Y 10/00* | (2011.01) |
| *B82Y 40/00* | (2011.01) |
| *G03F 7/00* | (2006.01) |
| *B29C 35/08* | (2006.01) |

(52) U.S. Cl.
CPC ................ *B29C 33/44* (2013.01); *B29C 33/424* (2013.01); *B29C 37/0003* (2013.01); *B29C 59/022* (2013.01); *B82Y 10/00* (2013.01); *B82Y 40/00* (2013.01); *G03F 7/0002* (2013.01); *B29C 2035/0827* (2013.01)

(58) Field of Classification Search
CPC ...... B29C 33/44; B29C 33/442; B29C 49/02; B29C 49/00; B29C 49/16

USPC .................................................. 264/293, 334
See application file for complete search history.

(56) References Cited

U.S. PATENT DOCUMENTS

| | | | | |
|---|---|---|---|---|
| 4,889,311 A | * | 12/1989 | Anglin ............... | B22D 17/2236 164/347 |
| 2007/0228589 A1 | * | 10/2007 | Choi ..................... | B82Y 10/00 264/39 |

FOREIGN PATENT DOCUMENTS

| | | |
|---|---|---|
| JP | 60-127544 A | 7/1985 |
| JP | 04-023244 A | 1/1992 |
| JP | 2008-290438 A | 12/2008 |
| JP | 2009-060084 A | 3/2009 |
| KR | 10-2008-0053061 A | 6/2008 |
| WO | 2004-114381 A1 | 12/2004 |

* cited by examiner

*Primary Examiner* — Christina Johnson
*Assistant Examiner* — Xue Liu
(74) *Attorney, Agent, or Firm* — Pearne & Gordon LLP

(57) ABSTRACT

An imprinting method is capable of separating a molding material and a target material rapidly in pattern formation. The imprinting method includes a transferring process for transferring an inverted pattern of a mold 10 having a desired pattern formed thereon to a resist 30 by pressing the mold 10 against the resist 30; a curing process for curing the resist 30 by heating or irradiating light; and a separating process for separating the mold 10 from the resist 30 after the resist 30 is cured through the transferring process. The separating process includes a pulling process for pulling the mold 10 away from the resist 30 in a direction opposite to a direction in which the resist 30 is pressed; and a pushing process for pushing the resist 30 in the same direction as a direction in which the mold 10 presses the resist 30.

8 Claims, 6 Drawing Sheets

2-2 CROSS SECTION 3-3 CROSS SECTION 4-4 CROSS SECTION

IMPRINTING METHOD

CROSS-REFERENCE TO RELATED APPLICATION

This application is a Continuation of International Application No. PCT/JP2011/052346 filed on Feb. 4, 2011, which claims the benefit of Japanese Patent Application No. 2010-031415 filed on Feb. 16, 2010. The entire disclosure of the prior application is incorporated herein by reference in its entirety.

FIELD OF THE INVENTION

The present disclosure relates to an imprinting method for transferring an inverted pattern of a molding material having a desired pattern formed thereon to a target material to be molded by pressing the molding material against the target material.

BACKGROUND OF THE INVENTION

In a semiconductor manufacturing process, a lithography technique is generally performed to form a desired pattern on a base material. Higher degree of microprocessing has also been achieved by a lithography technique using a short-wavelength laser or an electron beam.

However, the lithography technique performs a multiple number of processes such as pattern transfer, exposure and development. Further, it is expensive to obtain the short-wavelength laser such as ultraviolet (UV) and carry out maintenance thereof. Besides, an apparatus using the short-wavelength laser becomes scaled up and exposure time becomes longer. As a result, a high manufacturing cost is caused.

Meanwhile, it has been also proposed forming a desired pattern on a base material by an imprinting method (see, for example, Patent Documents 1 and 2). This method performs a smaller number of processes as compared to the lithography technique. Further, since there is no need for laser and pattern formation can be performed in the atmosphere, the configuration of the apparatus can be simplified. Thus, the imprinting method has an advantage over the lithography technique in the aspect of price and maintenance.

Patent Document 1: Japanese Patent Laid-open Publication No. 2009-060084
Patent Document 2: Pamphlet of International Publication No. 2004/114381

In the imprinting method, however, it takes much time to separate a molding material from a target material. This is because the molding material is not easily separated from the target material when lifting up the molding material after a pattern having protrusion and recess on the molding material is transferred to the target material by firmly pressing the molding material against the target material and the target material is then cured. As a result, only four sheets of wafers can be processed for an hour in the present situation. Thus, the throughput of the imprinting method is very poor.

BRIEF SUMMARY OF THE INVENTION

In view of the foregoing problem, illustrative embodiments provide a novel and improved imprinting method capable of separating a molding material and a target material rapidly in pattern formation.

In accordance with one aspect of an illustrative embodiment, there is provided the imprinting method. The imprinting method includes a pressing process for pressing the molding material having thereon a pattern against the target material to be molded to form an inverted pattern of the molding material on the target material; a transferring process for transferring the inverted pattern of the molding material to the target material by curing the target material by heating or irradiating light; and a separating process for separating the molding material from the target material after the target material is cured through the transferring process. Here, the separating process includes a pulling process for pulling the molding material away from the target material in a direction opposite to a direction in which the target material is pressed; and a pushing process for pushing the target material in the same direction as a direction in which the molding material presses the target material.

In this configuration, the separating process including the pushing process and the pulling process is performed. To be specific, in the pushing process, the target material is pressed in the same direction as a direction in which the target material is pressed. Further, in the pulling process, the molding material is pulled away from the target material in the direction opposite to the direction in which the target material is pressed. At this time, the pulling process and the pushing process may be performed while being coupled with each other or may be performed at the same time.

In a conventional separating method for only pulling the molding material away from the target material in the direction opposite to the direction in which the target material is pressed, it takes much time to separate the molding material from the target material. In the imprinting method in accordance with the illustrative embodiment, however, the molding material and the target material can be rapidly and easily separated from each other. As a consequence, the throughput of pattern formation can be improved.

The pushing process may push the target material in the same direction as the direction in which the molding material presses the target material by inserting at least one pin through at least one through hole of the molding material and bringing the at least one pin into contact with the target material.

The at least one pin and the at least one through hole of the molding material may be plural in number, and the pins to be brought into contact with the target material through the through holes may be arranged according to a pattern density on the molding material.

The at least one pin and the at least one through hole of the molding material may be plural in number, and the pins to be brought into contact with the target material through the through holes may be arranged at a regular interval.

A length of each of the pins may be equal to or larger than about five times a thickness of the molding material.

The imprinting method may be applied to at least one of pattern formation of a semiconductor device, pattern formation of a storage medium, pattern formation of a solar cell, pattern formation of a lens array, manufacture of a photonic crystal device and pattern formation of an antireflection film of a light emitting diode.

The pressing process may be performed in an atmosphere of a gas that is condensed under a temperature and a pressure obtained when the target material fills in a recess of the molding material.

As stated above, in accordance with the illustrative embodiment, it is possible to provide an imprinting method capable of separating a molding material and a target material rapidly in pattern formation.

BRIEF DESCRIPTION OF THE DRAWINGS

Non-limiting and non-exhaustive embodiments will be described in conjunction with the accompanying drawings.

Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
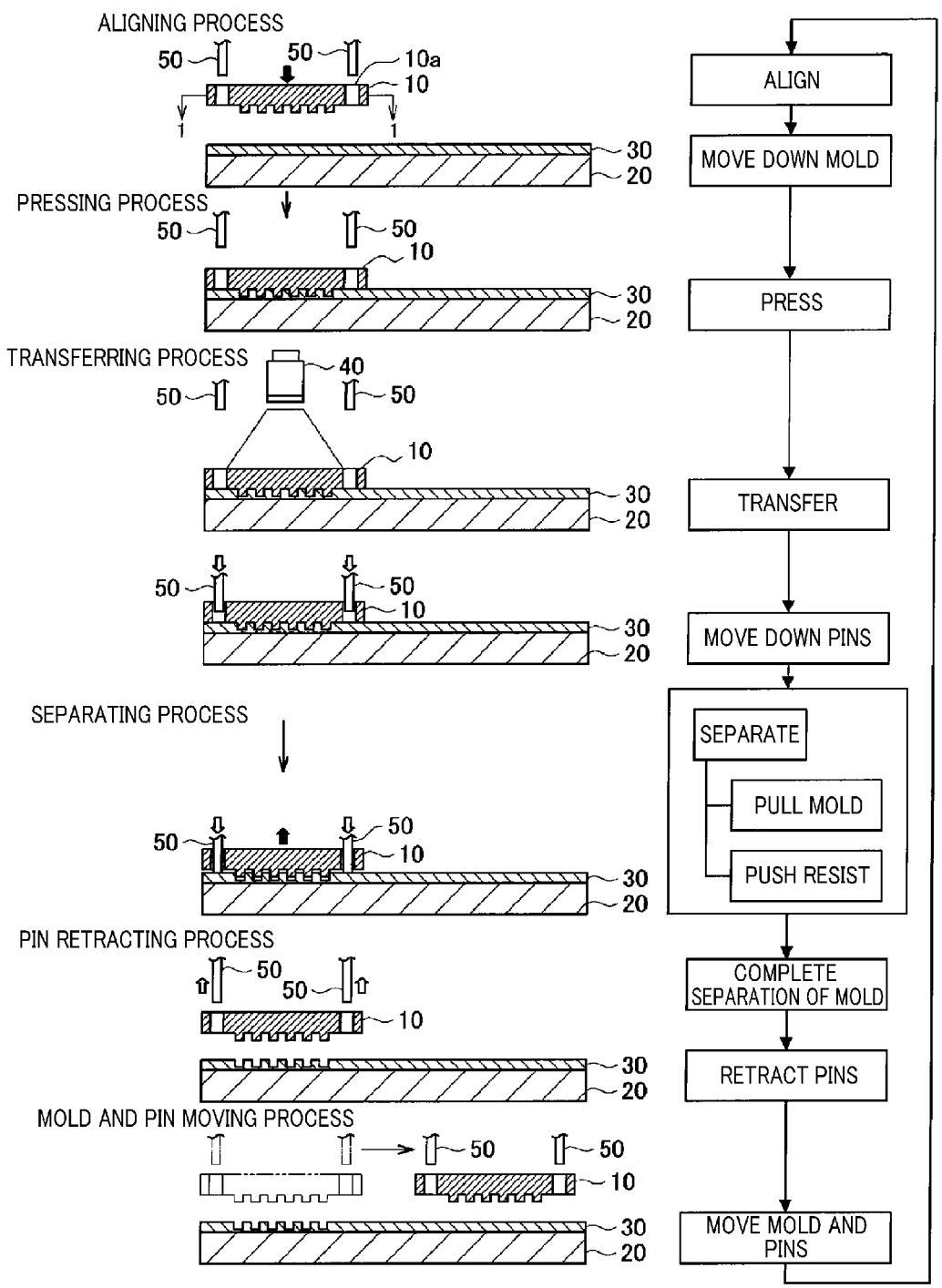
FIG. 1 is a process diagram of nano-imprinting in accordance with an illustrative embodiment.

Hereinafter, illustrative embodiments will be described in detail with reference to the accompanying drawings. Through the specification and drawings, parts having substantially the same functions and configurations will be assigned like reference numerals and redundant description will be omitted.

[Nano-Imprinting Process]

First, a nano-imprinting process in accordance with an illustrative embodiment will be described with reference to FIG. 1. Nano-imprinting is a microprocessing technique for transferring a pattern of a molding material called as "a mold" in the order of nanometer to a target material by pressing the molding material against the target material. For example, the nano-imprinting technique instead of a conventionally used lithography technique may be used for forming a pattern in a semiconductor manufacturing process to be described below.

In the nano-imprinting, the pattern is transferred to the target material by performing multiple processes including an aligning process, a pressing process, a transferring process, a separating process, a pin retracting process, and a mold and pin moving process.

In the following description, a mold 10 is used as a molding material in accordance with the present illustrative embodiment. The mold 10 is a member of quartz that transmits UV light, and a pattern having protrusion and recess thereon is formed on the surface of mold 10. FIG. 2 illustrates a 1-1 cross section of the mold 10 in the topmost diagram of FIG. 1. The mold 10 has a square cross section and is provided with nine equi-spaced through holes 10a.

Further, a base material 20 such as a silicon substrate is used as the target material to be molded in accordance with the illustrative embodiment. The base material 20 is coated with a resin. The resin portion on the base material 20 is also referred to as a resist 30. For the resist 30, a photo curable resin with low viscosity may be used. The photo curable resin is cured when UV light is irradiated thereto.

(Aligning Process)

Figure 2:
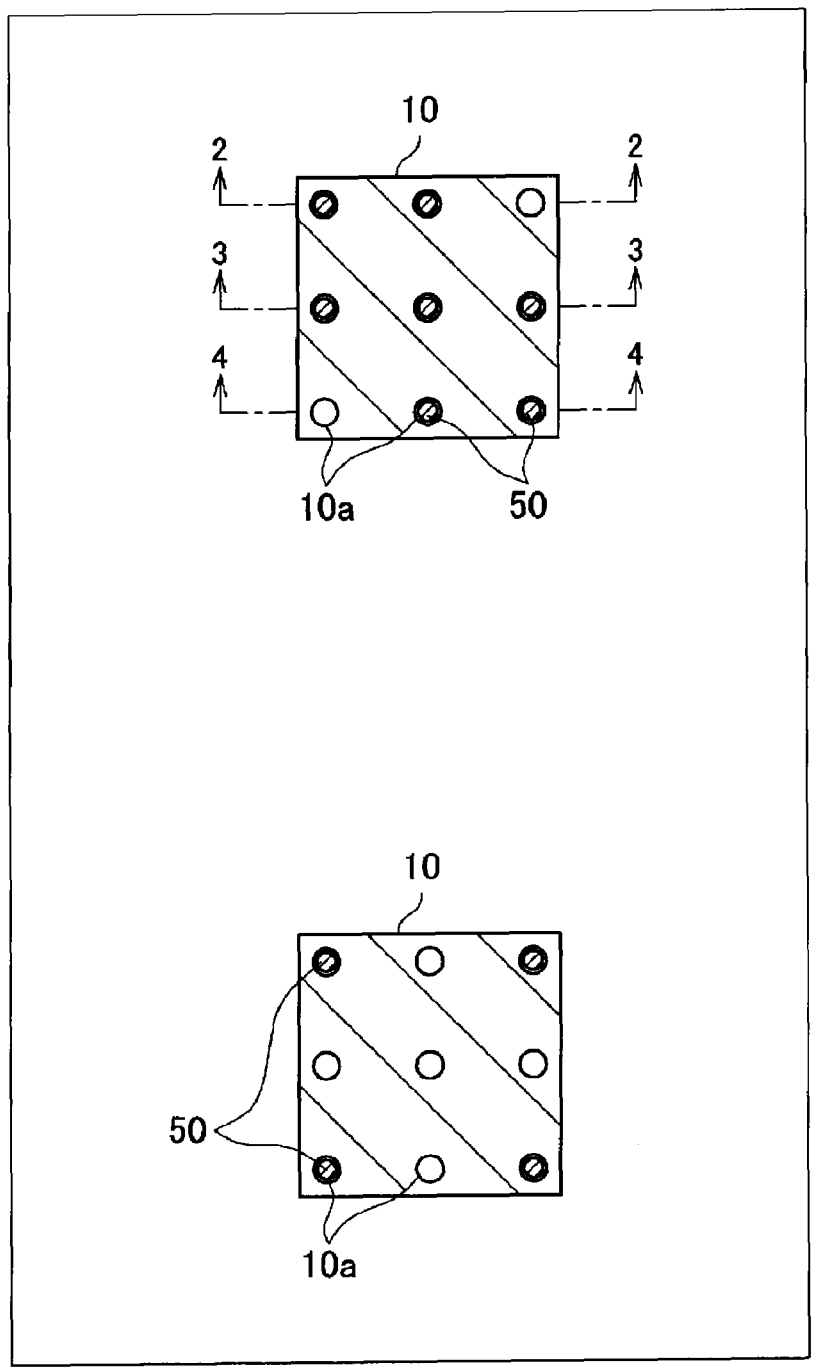
FIG. 2 is a diagram illustrating arrangement of a mold and pins in accordance with the illustrative embodiment.

An aligning process, as a first process in FIG. 1, is performed. In this aligning process, by employing a well-known method such as an optical method, the mold 10 and the base material 20 are aligned in X-Y directions (in surface directions of the base material 20).

(Pressing Process)

Then, a pressing process, as a second process in FIG. 1, is performed. In this pressing process, the mold 10 is moved down toward the base material 20, and the mold 10 is firmly pressed against the resist 30. As a result, the resist 30 enters recesses of the mold 10. In this way, the pattern having protrusion and recess of the mold 10 is formed on the resist 30.

(Transferring Process)

Subsequently, a transferring process, as a third process in FIG. 1, is performed. In the transferring process, UV light is irradiated from a UV light source, and the resist 30 on the base material 20 is cured. Through this process, the inverted pattern of the mold 10 is transferred to the resist 30. Since a photo curable resin that is cured rapidly at a room temperature is used as the resist 30, pattern deformation caused by heat and pressure does not occur. Thus, it is possible to perform a high-speed process.

(Separating Process)

Then, a separating process (releasing process), as a fourth process in FIG. 1, is performed. In the separating process, the mold 10 is separated from the resist 30 that has been cured through the transferring process. The separating process includes an operation (pulling process) of pulling the mold 10 in a direction opposite to a direction in which the resist 30 is pressed (here, a mold descending direction); and an operation (pushing process) of pushing the resist 30 in the same direction as the direction in which the mold 10 presses the resist 30.

In the pulling process, by raising the mold 10 in the direction opposite to the direction in which the resist 30 is pressed, as mentioned above, the mold 10 is separated from the resist 30. Only with this operation, however, the mold 10 is not readily separated from the resist 30 when the mold 10 is raised, which has been a major problem that causes low processing speed of pattern formation in the nano-imprinting method.

To resolve the problem, in the nano-imprinting method in accordance with the illustrative embodiment, a pushing process as well as the pulling process is performed. The pushing process includes inserting a multiple number of pins 50 through the through holes 10a of the mold 10 and pressing the pins 50 against the resist 30.

The pins 50 may be moved down after the resist 30 is cured or while the UV light is being irradiated. However, the pins 50 should be come into contact with the resist 30 after the resist 30 is cured. In this way, the pulling process and the pushing process are performed while being coupled with each other after the resist 30 is cured. Alternatively, the pulling process and the pushing process may be performed substantially at the same time.

(Pin Retracting Process)

Subsequently, a pin retracting process, as a fifth process of FIG. 1, is performed. In the pin retracting process, after the mold 10 is separated from the resist 30, the pins 50 are retracted and moved up to a position above the mold 10 so as not to interfere with the movement of the mold 10.

(Mold and Pin Moving Process)

Through the series of processes from the aligning process to the pin retracting process, a single pattern set is completely formed by nano-imprinting. Subsequently, in a mold and pin moving process as a final process of FIG. 1, the mold 10 and the pins 50 are slid to preset positions in order to form the pattern set at another portion of the resist 30 on the base material 20.

The series of processes from the aligning process to the mold and pin moving process are repeated until the pattern is transferred to the entire region of the base material. Through these processes, a required pattern is formed on the entire region of the base material.

As discussed above, in the pattern forming process using the nano-imprinting method in accordance with the illustrative embodiment, the mold 10 is separated from the resist 30 in the direction opposite to the direction in which the resist 30 is pressed while pushing down the resist 30 by the pins 50 in the same direction as the direction in which the resist 30 is pressed. Accordingly, the resist 30 and the mold 10, which would be difficult to separate only by moving the mold 10 away from the resist 30, can be securely and rapidly separated from each other. Thus, the throughput of the pattern formation can be improved.

[Pin Structure]

Now, characteristics and arrangement of the pins 50 used in the pushing process will be elaborated.

(Characteristics of Pins)

The pins 50 may be made of aluminum or stainless steel. Leading ends of the pins 50 are made of a fluorine-containing resin or a wholly aromatic polyimide resin having high rub resistance, such as Vespel (registered trademark) so as not to damage the resist 30.

Diameters of the pins 50 are set to be in the order of microns or millimeters depending on the degree of fineness of the pattern to be formed. Lengths of the pins 50 are set to be equal to or larger than about five times the thickness of the mold 10 and equal to or smaller than about ten times the thickness of the mold 10.

(Arrangement of Pins)

Now, arrangement of the pins when the pattern density of the mold 10 is irregular and arrangement of the pins when the pattern density of the mold 10 is regular will be explained with reference to FIGS. 2 and 3.

In the event that the pattern density of the mold 10 is irregular, the arrangement of the pins 50 that are brought into contact with the resist 30 through the through holes 10a is optimized for respective pattern densities on the mold 10.

Figure 3:
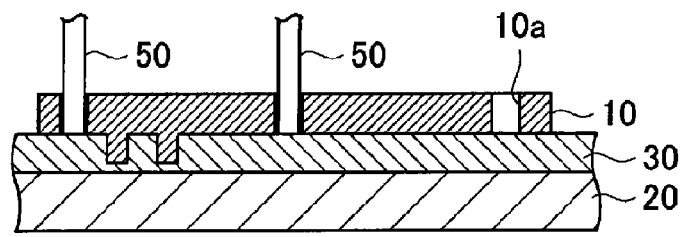
FIG. 3 is a diagram for describing a relationship between pattern density of the mold and arrangement of the pins in accordance with the illustrative embodiment.
Figure 3:
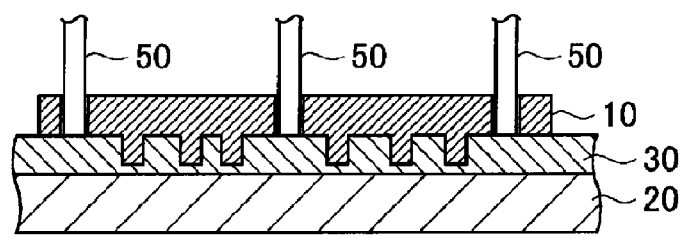
Figure 3:
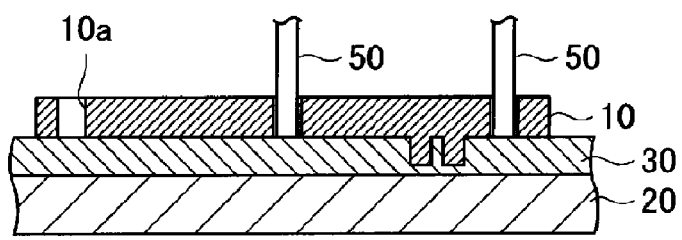

By way of example, the upper, the middle and the lower diagrams of FIG. 3 illustrate a 2-2 cross section, a 3-3 cross section and a 4-4 cross section of the mold 10 shown in the upper diagram of FIG. 2, respectively. In the upper diagram of FIG. 3, the pattern density of the mold 10 is dense in the left part and is sparse in the right part of the drawing. Accordingly, pins 50 are inserted through only two through holes 10a on the left side among the through holes 10a along a 2-2 cutting line of the upper diagram of FIG. 2, and the resist 30 is pressurized by a left pin 50 and a middle pin 50, as shown in the upper diagram of FIG. 3. In this way, the pins 50 for pressurizing the resist 30 are arranged more densely in the left part where the pattern density is high than the right part where the pattern density is low.

In the middle diagram of FIG. 3, the pattern density is dense in both the left part and the right part of the drawing. Accordingly, pins 50 are inserted through all of the through holes 10a on a 3-3 cutting line of the upper diagram of FIG. 2, and the entire resist 30 is uniformly pressurized by three pins 50, as illustrated in the middle diagram of FIG. 3. In this way, when the pattern density is uniformly high, the entire resist 30 is uniformly pressurized by the pins 50.

In the lower diagram of FIG. 3, the pattern density of the mold 10 is spare in the left part and dense in the right part of the drawing. Accordingly, pins 50 are inserted through only two through holes 10a on the right side among the through holes 10a along a 4-4 cutting lines of the upper diagram of FIG. 2, and the resist 30 is pressurized by a right pin 50 and the middle pin 50, as illustrated in the lower diagram of FIG. 3. In this way, the pins 50 for pressurizing the resist 30 are more densely arranged in the right part where the pattern density is high than the left part where the pattern density is low.

As stated above, when the pattern density of the mold 10 is irregular, the arrangement of the multiple number of pins 50 to be brought into contact with the resist 30 through the through holes 10a can be optimized according to the respective pattern densities on the mold 10. Hence, the mold 10 and the resist 30 can be separated from each other securely and rapidly.

When the pattern density of the mold 10 is regular, the multiple number of pins 50 to be brought into contact with the resist 30 through the multiple number of through holes 10a are arranged at a regular distance, as illustrated in the lower diagram of FIG. 2. In the lower diagram of FIG. 2, four pins 50 are inserted through four through holes 10a near the corners of the mold 10 and brought into contact with the resist 30 at a regular distance. However, the illustrative embodiment may not be limited to this arrangement, and, by way of example, the nine pins 50 are respectively inserted through the nine through holes 10a formed in the mold 10 so as to pressurize the resist 30.

[Pattern Forming Apparatus]

Figure 4:
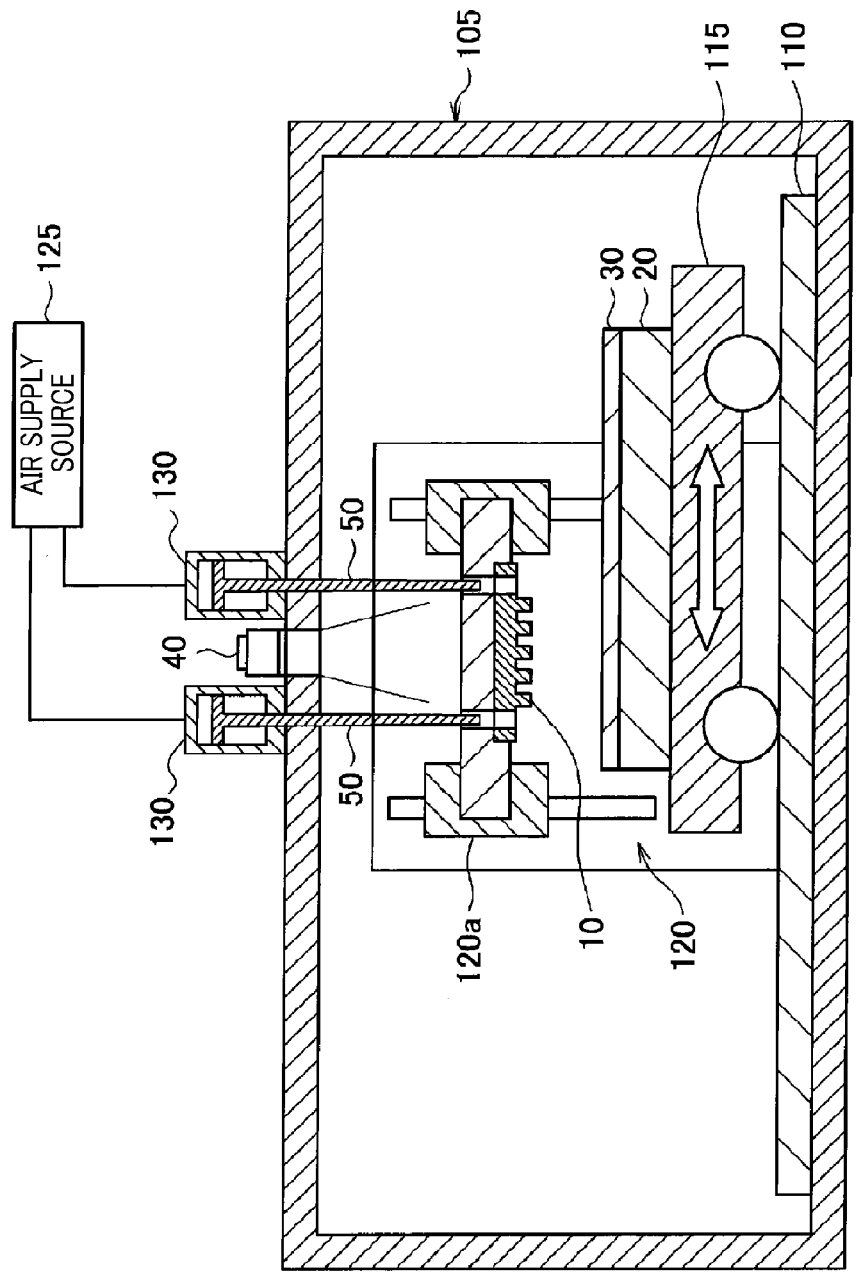
FIG. 4 is a longitudinal cross sectional view of a pattern forming apparatus configured to perform the nano-imprinting in accordance with the illustrative embodiment.

Now, a pattern forming apparatus configured to perform the nano-imprinting method in accordance with the above-described illustrative embodiment will be explained with reference to FIG. 4. FIG. 4 is a longitudinal cross sectional view illustrating an overall configuration of the pattern forming apparatus in accordance with the illustrative embodiment.

The pattern forming apparatus 100 includes a processing chamber 105 for performing therein the nano-imprinting method. In the processing chamber 105, a sliding stage 115 is provided on a surface plate 110. The sliding stage 115 is configured to be slid on a horizontal plane. With this configuration, the base material 20 (and the resist 30) on the sliding stage 115 is horizontally moved.

Within the processing chamber 105, there is provided an elevation stage 120 for moving the mold 10 up and down so as to allow the pattern having protrusion and recess on the bottom surface of the mold 10 to be pressed into the resist 30 located below the mold 10. As the sliding stage 115 is slid, the base material 20 is also moved, and if the base material 20 is stopped at a preset position, a mold pressing device (molding material pressing device) 120a is operated, so that the mold 10 is moved downward. If the mold 10 moving downward comes into contact with the resist 30, the pattern having protrusion and recess on the bottom surface of the mold 10 is pressed into the resist 30 that is softened, so that the pattern having protrusion and recess on the mold 10 is formed on the resist 30.

Thereafter, UV light is irradiated to the resist 30 through a sapphire window from a UV light source 40 provided on a ceiling surface of the processing chamber 105. As a result, the resist 30 is cured. While the resist 30 is being cured by the UV light or after cured, a certain amount of air is introduced into an air cylinder 130 from an air supply source 125 connected to the air cylinder 130. Accordingly, pins 50 connected to the air cylinder 130 are moved down toward the resist 30. Here, however, the pins 50 are not brought into contact with the resist 30 before the resist 30 is cured.

After the resist 30 is cured by the UV light, while bringing the pins 50 into contact with the resist 30 by supplying the air into the air cylinder, again, the mold 10 is moved up by the mold pressing device 120a. With this operation, the mold 10 can be easily separated from the resist 30.

The mold 10 is raised by the mold pressing device 120a. Further, by exhausting the certain amount of air from the inside of the air cylinder 130, the pins 50 connected to the air cylinder 130 are retracted above the mold 10. In this state, by moving the sliding stage 115, the base material 20 is horizontally moved so as to locate a next region of the resist 30 to be subjected to the nano-imprinting process under the bottom surface of the mold 10. Then, the same processes as described above are performed. Through these processes, the pattern by the nano-imprinting as shown in FIG. 1 is formed on the entire resist 30 by the pattern forming apparatus 100.

[Modification Example of the Pattern Forming Apparatus]

Figure 5:
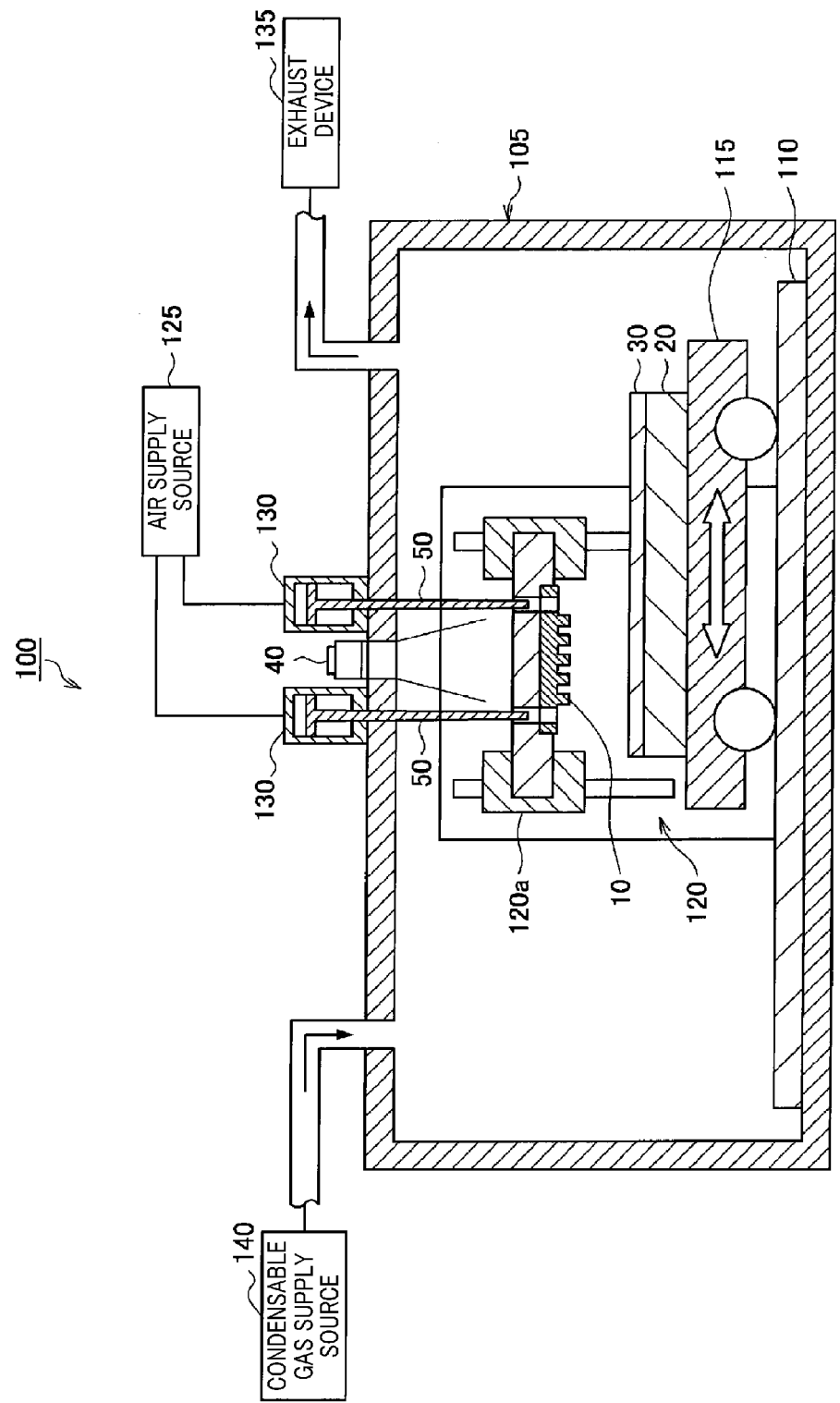
FIG. 5 is a longitudinal cross sectional view of a pattern forming apparatus for performing the nano-imprinting in accordance with a modification example of the illustrative embodiment.

Now, a pattern forming apparatus in accordance with a modification example of the illustrative embodiment will be described with reference to FIG. 5. FIG. 5 is a longitudinal cross sectional view illustrating an overall configuration of the pattern forming apparatus in accordance with the modification example.

In the pattern forming apparatus in accordance with this modification example, an exhaust device 135 and a condensable gas supply source 140 are further included in addition to the aforementioned pattern forming apparatus in accordance with the illustrative embodiment. In accordance with the modification example, the atmosphere within the processing chamber 105 is exhausted by using the exhaust device 135. Then, a certain condensable gas is supplied into the processing chamber 105 from the condensable gas supply source 140 such that a pressure within the processing chamber 105 reaches a preset pressure. At this time, a temperature within the processing chamber 105 may be a room temperature.

Here, the term "condensable gas" refers to a gas that can be condensed by a pressure that is generated when the resist 30 fills in a recess of the pattern of the mold 10 and pressurizes the gas confined in the recess during the imprinting process.

Various kinds of gases may be used as the condensable gas. By way of non-limiting example, trichlorofluoromethane having a vapor pressure of about 0.1056 MPa at a room temperature (about 23° C.) may be used as the condensable gas. The gas is supplied into the processing chamber 105 at a pressure slightly lower than the vapor pressure thereof, e.g., about 0.1 MPa. Desirably, a boiling point of a material constituting the condensable gas atmosphere may be of a temperature in the range of, e.g., about 15° C. to 30° C. (which is close to the room temperature) when the pressure within the processing chamber 105 is about 1 atmospheric pressure. However, the boiling point thereof may be appropriately changed based on a preset pressure within the processing chamber, depending on the kind of the condensable gas.

Now, an operation and an effect when performing the pattern forming process by the imprinting method under the condensable gas atmosphere will be discussed. In an upper diagram of the FIG. 6, there is illustrated an initial state of an imprinting operation performed by pressing the mold 10 against the resist 30 coated on the base material 20. Here, a pattern having protrusion and recess of the mold 10 is brought into contact with the resist 30. At this time, a recess 15a of the pattern on the bottom surface of the mold 10 is isolated from the external atmosphere, and, thus, the condensable gas 140a within the recess 15a is airtightly confined in the recess 15a.

Thereafter, if the mold 10 is further lowered, a protrusion 15b of the pattern on the bottom surface of the mold 10 is pressed into the softened resist 30, and the resist 30 fills in the recess 15a. Accordingly, the condensable gas 140a airtightly confined in the recess 15a is compressed and a pressure within the recess 15a is increased.

Figure 6:
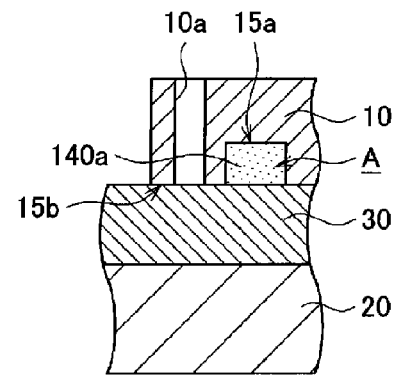
FIG. 6 is a diagram showing a part of a nano-imprinting process in accordance with the modification example.
Figure 6:
Figure 6:
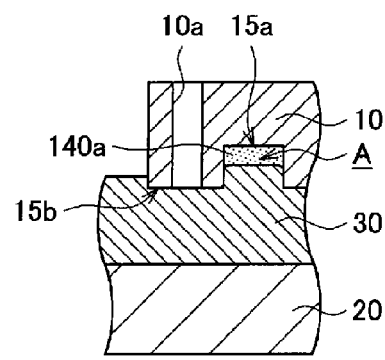
Figure 6:
Figure 6:
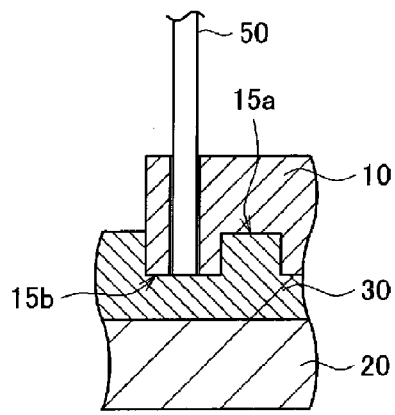

As illustrated in the middle diagram of FIG. 6, for example, the resist 30 within the recess 15a is moved up and compresses the condensable gas 140a in that space. As a result, the pressure within the space A in which the condensable gas 140a is confined increases in proportion to a volume decrease of the space A. Since a gas that is condensed into a liquid when compressed at the aforementioned operation temperature is selected as the condensable gas 140a, a part of the condensable gas 140a within the recess 15a is condensed as the condensable gas 140a is compressed.

Due to the condensation of the condensable gas 140a within the space A of the recess 15a, the pressure within the recess 15a is maintained to be equal to or lower than a vapor pressure of the condensable gas. If the pressure within the space A of the recess 15a is higher than the vapor pressure of the gas, the gas may be consecutively condensed, so that all the gas may be condensed and the resist 30 that has been introduced into the recess 15a fills almost the entire space A of the recess 15a.

As discussed above, in the nano-imprinting method using the pattern forming apparatus in accordance with the modification example, the space A of the recess 15a of the mold 10 can be filled with the resist 30 by the condensation of the condensable gas 140a. Accordingly, the problem that the pattern having protrusion and recess of the mold 10 may not be accurately transferred due to the residue of the compressed gas within the space A of the recess 15a, as in the conventional nano-imprinting method, can be resolved.

[Application Examples of the Pattern Forming Process by Nano-Imprinting]

Now, several application examples of utilizing the nano-imprinting method using the pattern forming apparatus in accordance with the illustrative embodiment or the pattern forming apparatus in accordance with the modification example thereof will be described.

1. Pattern Formation in a Semiconductor Manufacturing Process

By way of example, the imprinting method in accordance with the present illustrative embodiment or the modification example may be applied to a semiconductor manufacturing process for forming a metal wiring and a plug by a dual damascene method after forming a wiring groove or a via hole by using the imprinting method. By using this imprinting method instead of the conventional lithography technique, cost down can be achieved.

2. Pattern Formation in a Storage Medium Manufacturing Process

Further, the imprinting method in accordance with the present illustrative embodiment or the modification example may also be applicable to a required pattern formation on a storage medium such as a HDD (Hard Disk Drive) or a CD (Compact Disk) when manufacturing the storage medium. By way of example, the imprinting method may be applied to a discrete track media for forming data tracks while separating the data tracks magnetically in order to improve recording density of a HDD. The discrete track media is for ameliorating signal quality by removing a magnetic material in a portion unnecessary for recording (i.e., groove processing). When forming a required groove pattern on the storage medium, the imprinting method in accordance with the present illustrative embodiment or the modification example can be used. After forming the groove, by filling the groove with a non-magnetic material, the data tracks are magnetically separated.

3. Pattern Formation in a Solar Cell Manufacturing Process

In a solar cell manufacturing process, a pattern is formed on, e.g., a transparent conductive film (antireflection film), which is formed by coating $In_2O_3$—$SnO_2$-based sol on a light-transmitting substrate, by using the pattern forming apparatus in accordance with the present illustrative embodiment or the modification example. Here, a micro-scale pyramid structure is formed on the surface of the antireflection film. A Ni electroforming mold as a stamper (corresponding to the mold) has a multiple number of quadrangular pyramid-shaped protrusions. By pressing the protrusions of the Ni electroforming mold against the surface of the transparent conductive film for about 10 minutes while heating the Ni electroforming mold and the transparent conductive film, protrusion and recess are formed on the transparent conductive film.

In this way, by forming the pyramid-shaped protrusion and recess on the surface of the antireflection film, incident light is transmitted and reflected repeatedly by the pyramid structure on the surface of the antireflection film. As a result, a greater amount of light can be introduced into a solar cell, as compared to a flat surface.

4. Pattern Formation in a Lens Array Manufacturing Process

When manufacturing a micro lens array with a low coupling loss for use in optical coupling between optical fibers, a lens array pattern may be transferred by the imprinting method using the pattern forming apparatus in accordance with the present illustrative embodiment or the modification example. The micro lens array may be plastic or glass.

5. Pattern Formation on an Antireflection Film of a Light Emitting Diode

Besides, the imprinting method using the pattern forming apparatus in accordance with the present illustrative embodiment or the modification example may also be used to form a pattern on an antireflection film of a light emitting diode.

As stated above, the nano-imprinting method using the pattern forming apparatus in accordance with the present illustrative embodiment or the modification example may be applied to pattern formation for use in the manufacture of a magnetic storage medium such a high-density memory disk, a semiconductor integrated circuit, a flat screen, a micro electromechanical system (MEMS), a sensor device, an optical disk, an optical component such as a diffraction grating or a relief hologram, a nano device, an optical device, a polarizer or an optical film for manufacturing a flat panel display, a thin film transistor of a liquid crystal display, an organic transistor, a color filter, an overcoat layer, a column member, a rib member for liquid crystal orientation, a micro lens array, an immunoassay chip, a DNA separation chip, a micro reactor, a nano-bio device, an optical waveguide, an optical filter, a photonic crystal device, and so forth.

In the pattern formation of all these kinds, by the nano-imprinting method in accordance with the present illustrative embodiment or the modification example, once a mold is fabricated, a microstructure such as a nano-structure can be formed repeatedly in a simple way. Thus, the imprinting method is a very economic method, and a nano-machining technique producing less noxious wastes. Hence, the present method may have a wide variety of applications to various fields besides the aforementioned examples.

In accordance with the imprinting method in accordance with the illustrative embodiment or the modification example, the molding material and the target material can be separated rapidly and securely. Thus, throughput in the pattern formation can be improved.

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in the imprinting method in accordance with the present illustrative embodiment or the modification example, an optical imprinting method is employed. However, the illustrative embodiment is not limited thereto. By way of example, the imprinting method may be carried out by a thermal imprinting method.

In the thermal imprinting method, by curing a resin as a target material to be molded through heating, an inverted pattern of a mold as a molding material is transferred to the target material. The target material is prepared by coating a thermoplastic resin on a base material. The mold as the molding material may not be quartz, and, for example, a pattern may be formed on a silicon substrate or a silicon oxide layer on the silicon substrate. After the mold is pressed into the thermoplastic resin, a cooling process is performed such that the temperature is equal to or lower than a glass transition temperature. Thereafter, the mold and the thermoplastic resin are separated from each other. In this way, in the thermal imprinting method, heat is applied when transforming the resin, a pattern is pressed into the resin, and then, a cooling process is performed when the resin is cured.

In this thermal imprinting method, the process of separating the molding material from the target material after the target material is cured includes a pulling process for pulling the molding material away from the target material in a direction opposite to a direction in which the target material is pressed; and a pushing process for pushing the target material in the same direction as the direction in which the molding material presses the target material.

The target material to be molded in accordance with the illustrative embodiment may be a resin or glass. The molding material in accordance with the illustrative embodiment may be designed to transfer a pattern to the entire size of a wafer or to transfer a pattern to each of a plurality of units of a wafer.

What is claimed is:

1. An imprinting method comprising:
   a pressing process for pressing a molding material having thereon a pattern against a target material to be molded to form an inverted pattern of the molding material on the target material;
   a transferring process for transferring the inverted pattern of the molding material to the target material by curing the target material by heating or irradiating light; and
   a separating process for separating the molding material from the target material after the target material is cured through the transferring process,
   wherein the separating process includes:
   a pulling process for pulling the molding material away from the target material in a direction opposite to a direction in which the target material is pressed; and
   a pushing process for pushing the target material in the same direction as a direction in which the molding material presses the target material, and
   wherein the pressing process is performed in an atmosphere of a gas that is condensed under a temperature and a pressure obtained when the target material fills in a recess of the molding material.

2. The imprinting method of claim 1,
   wherein the pushing process pushes the target material in the same direction as the direction in which the molding material presses the target material by inserting at least one pin through at least one through hole of the molding material and bringing the at least one pin into contact with the target material.

3. The imprinting method of claim 1,
wherein the pulling process and the pushing process are performed while being coupled with each other.

4. The imprinting method of claim 3,
wherein the pulling process and the pushing process are performed at the same time.

5. The imprinting method of claim 2,
wherein the at least one pin and the at least one through hole of the molding material are plural in number, and
the pins to be brought into contact with the target material through the through holes are arranged according to a pattern density on the molding material.

6. The imprinting method of claim 2,
wherein the at least one pin and the at least one through hole of the molding material are plural in number, and
the pins to be brought into contact with the target material through the through holes are arranged at a regular interval.

7. The imprinting method of claim 2,
wherein a length of the at least one pin is equal to or larger than about five times a thickness of the molding material.

8. The imprinting method of claim 1,
wherein the imprinting method is applied to at least one of pattern formation of a semiconductor device, pattern formation of a storage medium, pattern formation of a solar cell, pattern formation of a lens array, manufacture of a photonic crystal device and pattern formation of an antireflection film of a light emitting diode.

* * * * *